US012772698B2

(12) United States Patent
Eun et al.

(10) Patent No.: US 12,772,698 B2
(45) Date of Patent: Oct. 20, 2026

(54) DISPLAY DEVICE

(71) Applicant: Samsung Display Co., LTD., Yongin-si (KR)

(72) Inventors: Sangwon Eun, Yongin-si (KR); Youngju Park, Yongin-si (KR); Seongsoo Yoo, Yongin-si (KR); Joosub Lee, Yongin-si (KR); Jinyoung Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 427 days.

(21) Appl. No.: 18/382,300

(22) Filed: Oct. 20, 2023

(65) Prior Publication Data

US 2024/0244926 A1 Jul. 18, 2024

(30) Foreign Application Priority Data

Jan. 18, 2023 (KR) ........................ 10-2023-0007510

(51) Int. Cl.
*H10K 59/80* (2023.01)
*C08K 5/12* (2006.01)
*C09J 133/06* (2006.01)

(52) U.S. Cl.
CPC ........... *H10K 59/8722* (2023.02); *C08K 5/12* (2013.01); *C09J 133/06* (2013.01); *H10K 59/872* (2023.02); *H10K 59/8792* (2023.02); *C09J 2203/326* (2013.01)

(58) Field of Classification Search
CPC ....................... H10K 50/8426; H10K 59/8722
See application file for complete search history.

(56) References Cited

U.S. PATENT DOCUMENTS

| | | | | |
|---|---|---|---|---|
| 2017/0200915 A1* | 7/2017 | Lee | ....................... | G06F 3/0412 |
| 2019/0173050 A1* | 6/2019 | Eo | ....................... | H10K 59/8791 |
| 2023/0136807 A1* | 5/2023 | Fujiwara | ........... | C08F 220/1808 428/841 |

FOREIGN PATENT DOCUMENTS

| | | | |
|---|---|---|---|
| KR | 1020100002638 | A | 1/2010 |
| KR | 1020130000286 | A | 1/2013 |
| KR | 101362869 | B1 | 2/2014 |
| KR | 101983296 | B1 | 5/2019 |
| KR | 1020200129552 | A | 11/2020 |
| WO | 2011158840 | A1 | 12/2011 |

OTHER PUBLICATIONS

Extended European Search Report mailed May 27, 2024 in EP Application No. 24152207.7, 10 pages.
Allnex, Ebecryl Technical Datasheet, XP 93157632 A; 2021; www.allnex.com (2 Pages).

* cited by examiner

*Primary Examiner* — Benjamin P Sandvik
(74) *Attorney, Agent, or Firm* — CANTOR COLBURN LLP

(57) ABSTRACT

A display device includes: a display panel including a display area, in which a plurality of pixels are arranged, and a peripheral area adjacent to the display area, a polarizing member disposed on the display panel, a cover window disposed on the polarizing member, and an adhesive layer attaching the polarizing member and the cover window, where the adhesive layer has a stress relaxation rate in a range of about 0.36 to about 0.45.

19 Claims, 8 Drawing Sheets

DISPLAY DEVICE

This application claims priority to Korean Patent Application No. 10-2023-0007510, filed on Jan. 18, 2023, and all the benefits accruing therefrom under 35 U.S.C. § 119, the content of which in its entirety is herein incorporated by reference.

BACKGROUND

1. Field

Embodiments provide generally to a display device. More particularly, embodiments relate to a display device that provides visual information.

2. Description of the Related Art

With the development of information technology, the importance of a display device, which is a connection medium between a user and information, has been highlighted. For example, the use of a display device such as a liquid crystal display device, an organic light emitting display device, a plasma display device, or the like is increasing.

Recently, a display device with reduced dead space by using a substrate including a flexible material is being developed. The dead space of the display device may refer to a non-display area in which an image is not displayed, located around a display area where an image is displayed.

SUMMARY

Embodiments provide a display device with reduced dead space.

A display device according to embodiments of the disclosure includes a display panel including a display area, in which a plurality of pixels are arranged, and a peripheral area adjacent to the display area, a polarizing member disposed on the display panel, a cover window disposed on the polarizing member, and an adhesive layer attaching the polarizing member and the cover window, where the adhesive layer has a stress relaxation rate in a range of about 0.36 to about 0.45.

In an embodiment, the adhesive layer may have a creep value in a range of about 6% to about 7%.

In an embodiment, the adhesive layer may include a monomer, an oligomer, a photo initiator, a crosslinking agent, and a molecular weight control agent.

In an embodiment, the crosslinking agent may include a first crosslinking agent having three functional groups and a second crosslinking agent having four functional groups.

In an embodiment, each of the first crosslinking agent and the second crosslinking agent may have an acrylate functional group.

In an embodiment, the first crosslinking agent may include pentaerythritol triacrylate (PETA), and the second crosslinking agent may include pentaerythritol tetraacrylate (PETTA).

In an embodiment, a content of the first crosslinking agent may be in a range of about 0.1 weight percent (wt %) to about 0.3 wt % based on a total content of the adhesive layer, and a content of the second crosslinking agent may be in a range of about 0.1 wt % to about 0.2 wt % based on the total content of the adhesive layer.

In an embodiment, the oligomer may include 2-hydroxyethylhexyl acrylate.

In an embodiment, the monomer may include at least one selected from 2-hydroxyethyl acrylate, butyl acrylate, isooctyl acrylate, and isobornyl acrylate.

In an embodiment, the adhesive layer may have a modulus in a range of 0.15 megapascal (Mpa) to about 0.3 Mpa at a room temperature.

In an embodiment, the adhesive layer may include an optically clear adhesive (OCA).

In an embodiment, the display device may further include a light blocking layer disposed on a lower surface of the cover window and overlapping a part of the peripheral area.

A display device according to embodiments of the disclosure includes a display panel including a display area, in which a plurality of pixels are arranged, and a peripheral area adjacent to the display area, a polarizing member disposed on the display panel, a cover window disposed on the polarizing member, and an adhesive layer attaching the polarizing member and the cover window, where the adhesive layer has a stress relaxation rate in a range of about 0.36 to about 0.45, a creep value in a range of about 6% to about 7%, and a modulus in a range of about 0.15 Mpa to about 0.3 Mpa at a room temperature.

In an embodiment, the adhesive layer may include a monomer, an oligomer, a photo initiator, a crosslinking agent, and a molecular weight control agent.

In an embodiment, the crosslinking agent may include a first crosslinking agent having three functional groups and a second crosslinking agent having four functional groups.

In an embodiment, each of the first crosslinking agent and the second crosslinking agent may have an acrylate functional group.

In an embodiment, the first crosslinking agent may include PETA, and the second crosslinking agent may include PETTA.

In an embodiment, a content of the first crosslinking agent may be in a range about 0.1 wt % to about 0.3 wt % based on a total content of the adhesive layer, and a content of the second crosslinking agent may be in a range about 0.1 wt % to about 0.2 wt % based on the total content of the adhesive layer.

In an embodiment, the adhesive layer may include an OCA.

In an embodiment, the display device may further include a light blocking layer disposed on a lower surface of the cover window and overlapping a part of the peripheral area.

A display device according to embodiments may include an upper adhesive layer which attaches a polarizing member and a cover window to each other and has a stress relaxation rate in a range of about 0.36 to about 0.45. Accordingly, bubbles penetrating into the upper adhesive layer from the outside may not remain after an autoclave process. In addition, as bubbles do not remain in the upper adhesive layer, the dead space of the display device may be allowed to be reduced.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
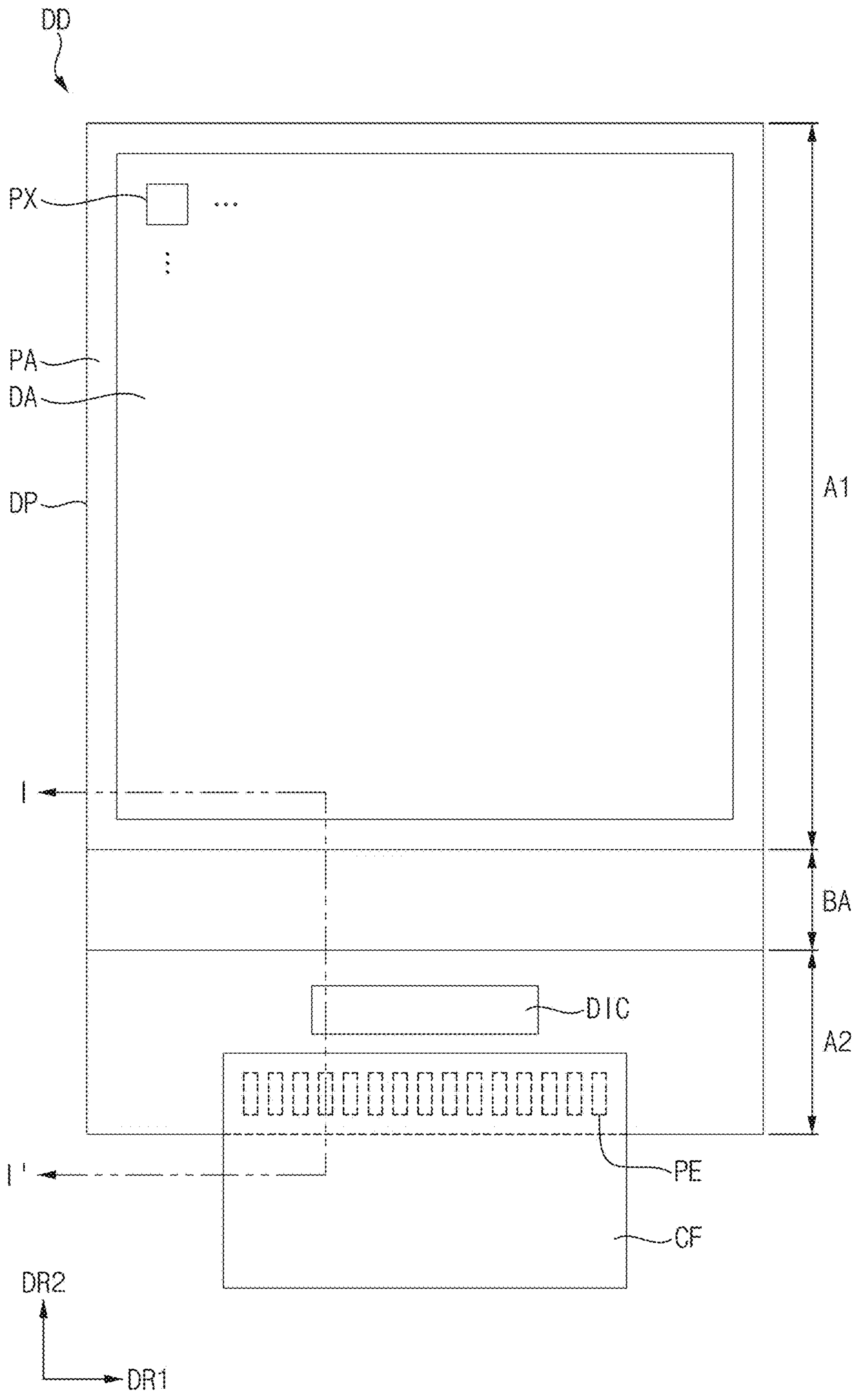
FIG. 1 is a plan view illustrating a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, a display device according to embodiments of the disclosure will be explained in detail with reference to the accompanying drawings. The same reference numerals are used for the same components in the drawings, and any repetitive detailed descriptions of the same components may be omitted or simplified.

Figure 2:
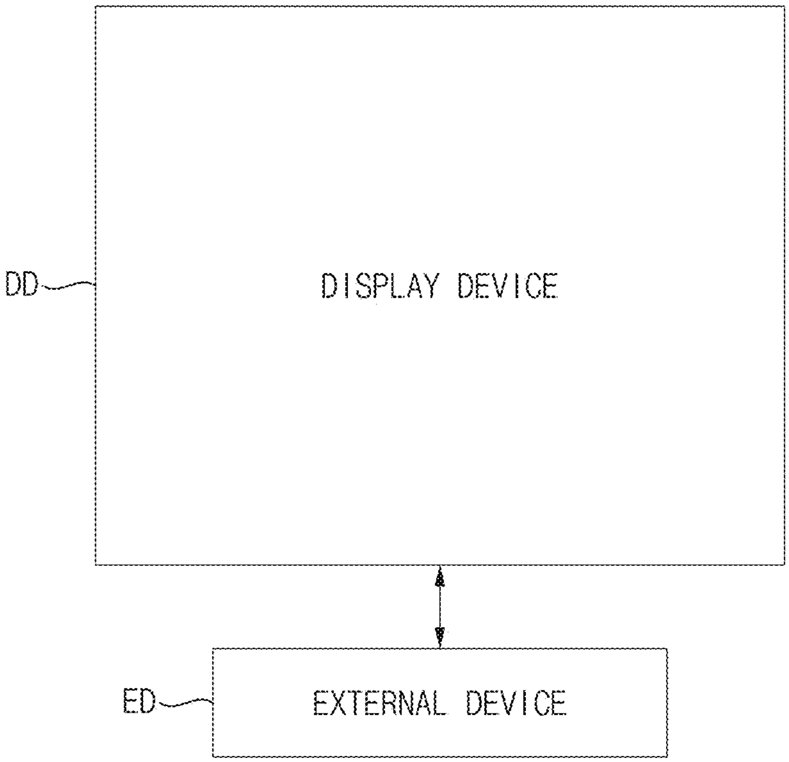
FIG. 2 is a block diagram illustrating an external device electrically connected to the display device of FIG. 1.

FIG. 1 is a plan view illustrating a display device according to an embodiment of the disclosure FIG. 2 is a block diagram illustrating an external device electrically connected to the display device of FIG. 1. Particularly, a display device DD illustrated in FIG. 1 is in a state before the display panel (e.g., the display panel DP of FIGS. 3 and 4) is bent.

Referring to FIGS. 1 and 2, the display device DD according to an embodiment may include a display panel DP, a driving integrated circuit DIC, pad electrodes PE, and a connection film CF.

In an embodiment, the display device DD may have a rectangular planar shape. However, the disclosure is not limited thereto, and the display device DD may have one of other various planar shapes.

The display panel DP may include a first area A1, a bending area BA, and a second area A2. Here, the first area A1 may include the display area DA and the peripheral area PA.

The display area DA may be defined as an area in which an image is displayed by generating light or adjusting transmittance of light provided from an external light source. The peripheral area PA may be defined as an area not for displaying an image. In addition, the peripheral area PA may surround at least a part of the display area DA. In an embodiment, for example, the peripheral area PA may entirely surround the display area DA.

The second area A2 may be spaced apart from one side of the display area DA in a direction opposite to a second direction DR2 parallel to an upper surface of the display panel DP. The second area A2 may be defined as a pad area. The bending area BA may be positioned between the display area DA and the second area A2 in a plan view.

The peripheral area PA, the bending area BA, and the second area A2 may be defined as non-display areas that do not display an image.

A plurality of pixels PX may be disposed in the display area DA. Each of the plurality of pixels PX may emit light. As each of the plurality of pixels PX emits light, the display area DA may display an image. In an embodiment, for example, the plurality of pixels PX may be arranged in a matrix form along a first direction DR1 and the second direction DR2 crossing the first direction DR1.

Lines connected to the pixels PX may be further disposed in the display area DA. In an embodiment, for example, the lines may include a data signal line, a gate signal line, or a power line.

A driver for driving the plurality of pixels PX may be disposed in the peripheral area PA. In an embodiment, for example, the driver may include a data driver, a gate driver, a light emitting driver, a power voltage generator, a timing controller, or the like. The plurality of pixels PX may emit light based on signals transmitted from the driver.

The driving integrated circuit DIC may be disposed in the second area A2 on the display panel DP. The driving integrated circuit DIC may convert a digital data signal among driving signals into an analog data signal and provide the converted analog data signal to the plurality of pixels PX. In an embodiment, for example, the driving integrated circuit DIC may be a data driver.

The pad electrodes PE may be disposed in the second area A2 on the display panel DP. The pad electrodes PE may be spaced apart from each other in the first direction DR1. Here, the first direction DR1 may be a direction substantially parallel to the upper surface of the display panel DP. Some of the pad electrodes PE may be connected to the driving integrated circuit DIC through a line, and the rest of the pad electrodes PE may be connected to the plurality of pixels PX through a line. Each of the pad electrodes PE may include a metal, an alloy, a metal nitride, a conductive metal oxide, a transparent conductive material, or the like. These may be used alone or in combination with each other.

One end of the connection film CF may be electrically connected to the pad electrodes PE, and an opposing end of the connection film CF may be electrically connected to an external device ED. That is, driving signals and driving voltages generated from the external device ED may be provided to the driving integrated circuit DIC and the plurality of pixels PX through the connection film CF and the pad electrodes PE. In an embodiment, for example, the connection film CF may include a flexible printed circuit board (FPCB), a printed circuit board (PCB), a flexible flat cable (FFC), and/or the like.

In an embodiment, as illustrated in FIG. 2, the external device ED may be electrically connected to the display device DD. In an embodiment, for example, the external device ED may be electrically connected to the display device DD through the connection film CF. The external device ED may generate a driving signal and a driving voltage to display an image on the display device DD.

In this specification, a plane may be defined as the first direction DR1 and the second direction DR2 crossing the first direction DR1. In an embodiment, for example, the first direction DR1 may be perpendicular to the second direction DR2.

Hereinafter, components included in the display device DD will be described in detail.

Figure 3:
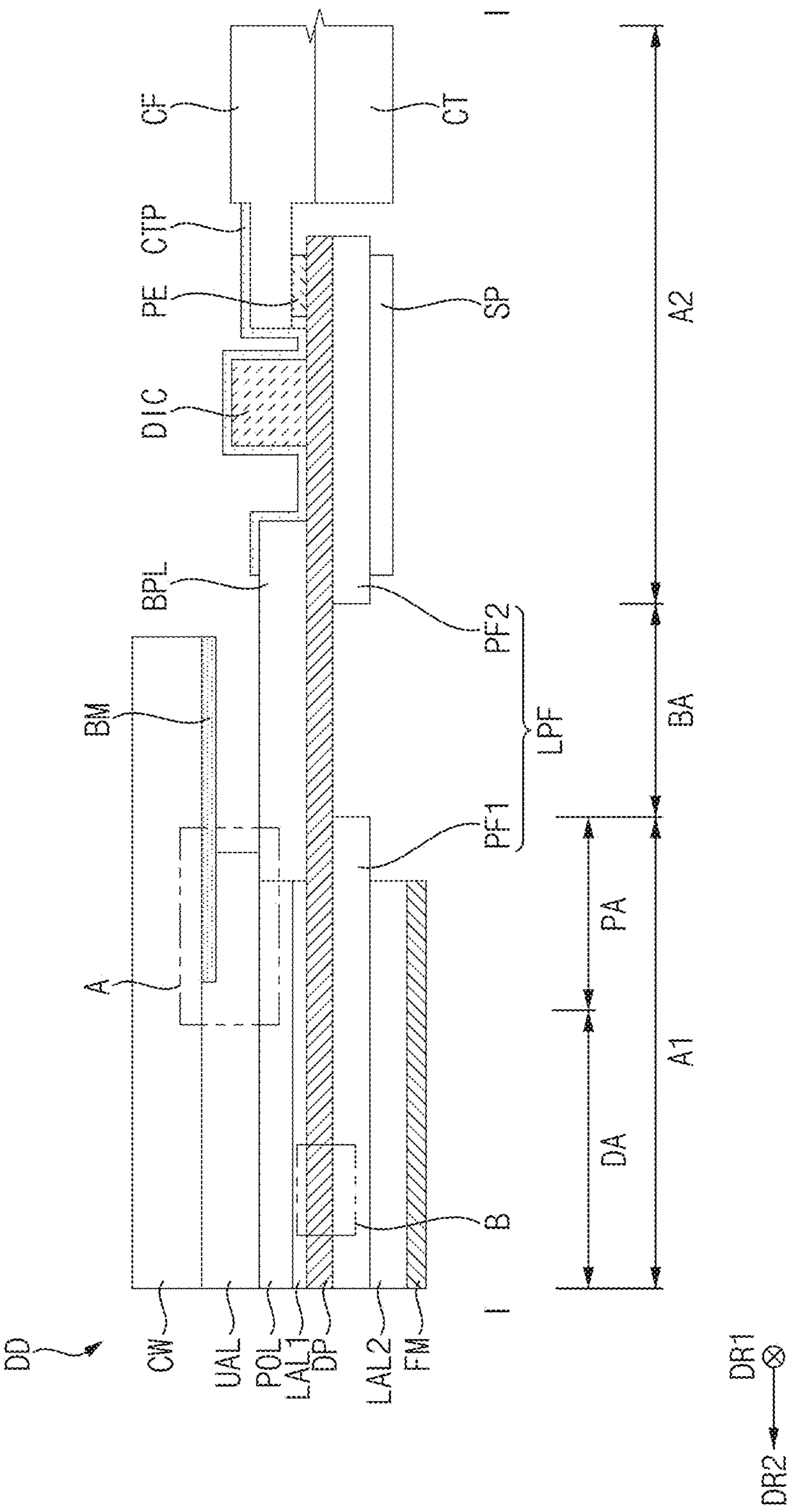
FIG. 3 is a cross-sectional view taken along line I-I' of FIG. 1.
Figure 4:
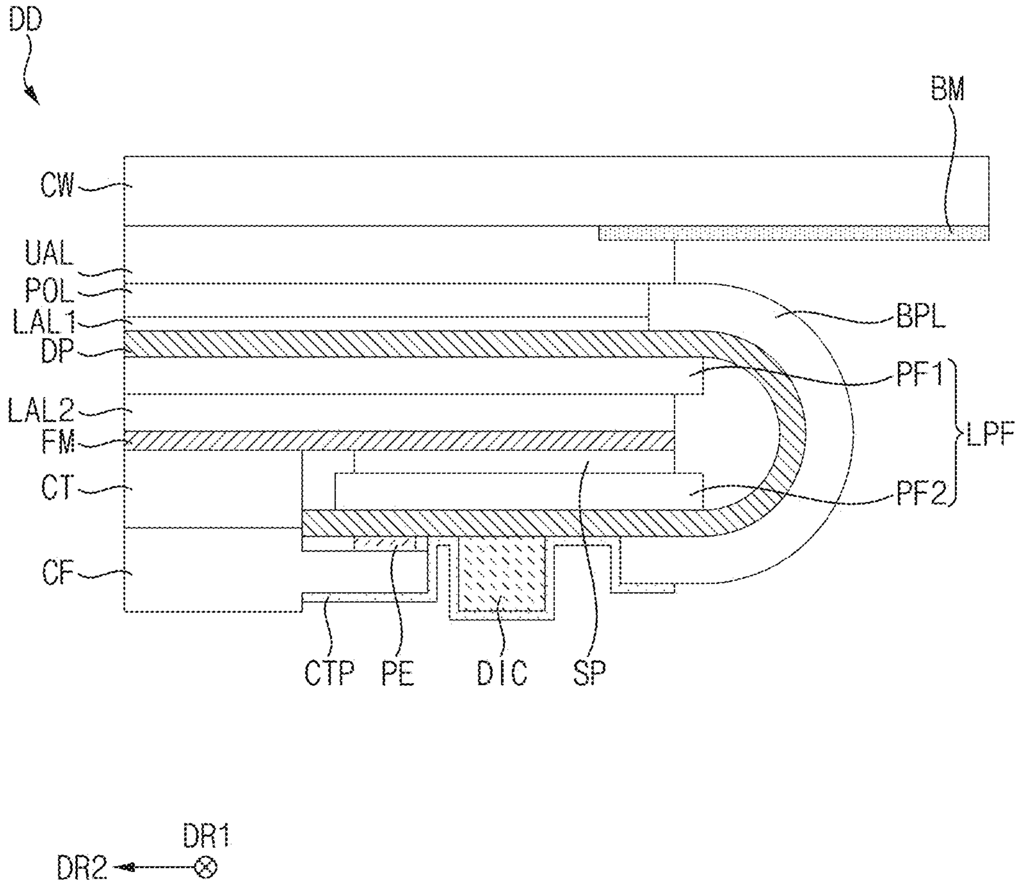
FIG. 4 is a cross-sectional view illustrating a bent shape of the display device of FIG. 3.

FIG. 3 is a cross-sectional view taken along line I-I' of FIG. 1. FIG. 4 is a cross-sectional view illustrating a bent shape of the display device of FIG. 3. Particularly, the display device DD illustrated in FIG. 3 is in a state before the display panel DP is bent, and the display device DD illustrated in FIG. 4 is in a state where the display panel DP is bent. In the display device DD, a part of the display panel DP overlapping the bending area BA may be provided in a bent state.

Referring to FIGS. 3 and 4, the display device DD according to an embodiment of the disclosure may include the display panel DP, the pad electrode PE, a lower protective film LPF, a first lower adhesive layer LAL1, a second lower adhesive layer LAL2, a spacer SP, a functional member FM, a polarizing member POL, a bending protection layer BPL, an upper adhesive layer UAL, a cover window CW, a light blocking layer BM, the driving integrated circuit DIC, a cover tape CT, the connection film CF, and a conductive tape CTP. Here, the lower protective film LPF may include a first protective film PF1 and a second protective film PF2. Hereinafter, any repetitive detailed descriptions of the same or like elements as those of the display device DD described with reference to FIG. 1 will be omitted.

The lower protective film LPF may be disposed on the lower surface of the display panel DP. In an embodiment, the first protective film PF1 may be disposed in the first area A1 on the lower surface of the display panel DP, and the second protective film PF2 may be disposed in the second area A2 on the lower surface of the display panel DP. That is, the lower protective film LPF may not be disposed in the bending area BA. The lower protective film LPF may protect the lower surface of the display panel DP.

The lower protective film LPF may include an inorganic material and/or an organic material. In an embodiment, for example, the lower protective film LPF may include an organic material such as photoresist, polyacrylic resin, polyimide resin, polyamide resin, siloxane resin, acrylic resin, epoxy resin, or the like. These may be used alone or in combination with each other.

An adhesive layer may be disposed between the display panel DP and the lower protective film LPF. The adhesive layer may attach the lower protective film LPF to the lower surface of the display panel DP. A part of the adhesive layer may overlap the bending area BA.

The second lower adhesive layer LAL2 may be disposed on the lower surface of the first protective film PF1. The second lower adhesive layer LAL2 may attach the functional member FM to the lower surface of the first protective film PF1. In an embodiment, for example, the second lower adhesive layer LAL2 may include optical clear adhesive (OCA), pressure sensitive adhesive (PSA), optical clear resin (OCR), or the like. These may be used alone or in combination with each other.

The functional member FM may be disposed on the lower surface of the lower adhesive layer LAL. In an embodiment, for example, the functional member FM may include a digitizer, a heat dissipation plate, or the like. The digitizer may be a device that converts coordinates of an input unit into digital data when the input unit such as a pen is brought into contact with the cover window CW. The digitizer may operate using an electromagnetic resonance method. In addition, the heat dissipation plate may dissipate heat transmitted to the lower surface of the display panel DP. The heat dissipation plate may include a material having high thermal conductivity. In an embodiment, for example, the heat dissipation plate may include graphite. Alternatively, the heat dissipation plate may include aluminum (Al), an alloy containing aluminum, copper (Cu), an alloy containing copper, silver (Ag), an alloy containing silver, or the like. These may be used alone or in combination with each other.

The spacer SP may be disposed on the lower surface of the second protective film PF2. In an embodiment, as shown in FIG. 4, the spacer SP may compensate for a step difference. Alternatively, the spacer SP may include an adhesive material, and the spacer SP may be fixed to the lower surface of the functional member FM. In an embodiment, for example, the spacer SP may include an organic insulating material such as photoresist, polyacrylic resin, polyimide-based resin, polyamide-based resin, siloxane-based resin, acrylic resin, epoxy-based resin, or the like. These may be used alone or in combination with each other.

The polarizing member POL may be disposed in the first area A1 on the display panel DP. In detail, the polarizing member POL may overlap a part of the display area DA and the peripheral area PA. The polarizing member POL may block external light incident on the display panel DP from the outside.

The first lower adhesive layer LAL1 may be disposed between the polarizing member POL and the display panel DP. The first lower adhesive layer LAL1 may overlap a part of the display area DA and the peripheral area PA. The first lower adhesive layer LAL1 may attach the polarizing member POL to the upper surface of the display panel DP. In an embodiment, for example, the first lower adhesive layer LAL1 may include OCA, OCR, PSA, or the like. These may be used alone or in combination with each other.

The bending protection layer BPL may be disposed on the display panel DP. The bending protection layer BPL may overlap a part of the peripheral area PA, a part of the bending area BA, and a part of the second area A2. The bending protection layer BPL may raise a neutral plane of the display device DD in the bending area BA.

The bending protection layer BPL may include a photocurable resin and/or a thermosetting resin. In an embodiment, for example, the bending protection layer BPL may include an epoxy resin, an amino resin, a phenol resin, a urea resin, a melamine resin, an unsaturated polyester resin, an unsaturated polyester resin, polyurethane resin, polyimide resin, or the like. These may be used alone or in combination with each other.

The upper adhesive layer UAL may be disposed on the polarizing member POL and the bending protection layer BPL. The upper adhesive layer UAL may be disposed on a part of the bending protection layer BPL and the polarizing member POL. The upper adhesive layer UAL may attach the cover window CW and the light blocking layer BM to the polarizing member POL and the bending protection layer BPL. In an embodiment, the upper adhesive layer UAL may include OCA. In an embodiment, where the upper adhesive layer UAL includes OCA, the OCA of the upper adhesive layer UAL may be a material that is not cured by ultraviolet rays. The upper adhesive layer UAL may be referred to as an adhesive layer.

In an embodiment, where the upper adhesive layer UAL includes OCA, the upper adhesive layer UAL may include a monomer, an oligomer, a photo initiator, a crosslinking agent, and a molecular weight modifier.

In an embodiment, for example, the monomer of the upper adhesive layer UAL may include 2-hydroxyethyl acrylate, butyl acrylate, isooctyl acrylate, and isobornyl acrylate. In such an embodiment, based on the total content of the upper adhesive layer UAL, the content of 2-hydroxyethyl acrylate may be in a range of about 10 weight percent (wt %) to about 15 wt %, the content of butyl acrylate may be in a range of about 2 wt % to about 3 wt % %, the content of the isooctyl acrylate may be in a range of about 1 wt % to about 2 wt %, and the content of the isobornyl acrylate may be in a range of about 1 wt % to about 2 wt %. However, embodiments of the disclosure are not limited thereto.

In an embodiment, for example, the oligomer of the upper adhesive layer UAL may include 2-hydroxyethylhexyl acrylate. In such an embodiment, based on the total content of the upper adhesive layer UAL, the content of 2-hydroxyethylhexyl acrylate may be in a range of about 65 wt % to about 75 wt %. However, embodiments of the disclosure are not limited thereto.

In an embodiment, for example, the photo initiator of the upper adhesive layer UAL may include Irgacure 184 and Irgacure 651, products of Ciba Specialty Chemical. In such an embodiment, based on the total content of the upper adhesive layer UAL, the content of Irgacure 184 may be in a range of about 0.3 wt % to about 0.6 wt %, and the content of Irgacure 651 may be in a range of about 0.1 wt % to about 0.2 wt %. However, embodiments of the disclosure are not limited thereto.

In an embodiment, for example, the crosslinking agent of the upper adhesive layer UAL may include a first crosslinking agent and a second crosslinking agent. In an embodiment, the first crosslinking agent may have three functional groups, and the second crosslinking agent may have four functional groups. As the first crosslinking agent has three functional groups and the second crosslinking agent has four functional groups, crosslinking reaction site may increase and crosslinking density may be improved.

Each of the first crosslinking agent and the second crosslinking agent may have an acrylate functional group. In an embodiment, for example, the first crosslinking agent may include pentaerythritol triacrylate (PETA) and the second crosslinking agent may include pentaerythritol tetraacrylate (PETTA). In such an embodiment, based on the total content of the upper adhesive layer UAL, the content of the pentaerythritol triacrylate may be in a range of about 0.1 wt % to about 0.3 wt % and the content of the pentaerythritol tetraacrylate may be in a range of about 0.1 wt % to about 0.2 wt %. However, embodiments of the invention are not limited thereto.

In an embodiment, for example, the molecular weight modifier of the upper adhesive layer UAL may include n-dodecyl mercaptan. In such an embodiment, based on the total content of the upper adhesive layer UAL, the content of the n-dodecyl mercaptan may be in a range of about 0.1 wt % to about 0.2 wt %. However, embodiments of the disclosure are not limited thereto.

In an embodiment, a stress relaxation rate (also referred to as “SR”) of the upper adhesive layer UAL may be in a range of about 0.36 to about 0.45. In an embodiment, for example, the stress relaxation rate of the upper adhesive layer UAL may be in a range of about 0.4 to about 0.45. The stress relaxation rate may be a scale to measure of the crosslinking density of a polymer.

If the stress relaxation rate of the upper adhesive layer UAL is less than about 0.36, bubbles penetrating thereinto from the outside may be trapped on the side surfaces of the upper adhesive layer UAL. If the stress relaxation rate of the upper adhesive layer UAL is greater than about 0.45, the upper adhesive layer UAL may have a hard property, such that the step difference formed in the light blocking layer BM may not be removed.

In the specification, the stress relaxation rate may be defined as a ratio of a stress relaxation modulus measured after a certain period of time to an initial stress relaxation modulus when strain is applied to the upper adhesive layer UAL and then the strain is removed. For example, the stress relaxation rate may be defined as the ratio of the stress relaxation modulus measured after about 300 seconds to the initial stress relaxation modulus when the strain is removed after maintaining about 25% strain in the upper adhesive layer for about 0.1 seconds.

In an embodiment, the creep value of the upper adhesive layer UAL may be in a range of about 6% to about 7%. The creep value may mean a degree of increase after about 600 seconds under a constant load. If the creep value of the upper adhesive layer UAL is out of the above range, the step difference formed in the light blocking layer BM may not be removed. The stress relaxation rate and the creep value of the upper adhesive layer UAL have a trade-off relationship.

In an embodiment, the modulus of the upper adhesive layer UAL at a room temperature may be in a range of about 0.15 Mpa to about 0.3 Mpa. If the modulus of the upper adhesive layer UAL is out of the above range at a room temperature, strain of the upper adhesive layer UAL may occur. Here, the room temperature may be a temperature in a range of about 15 degrees Celsius to about 25 degrees Celsius, e.g., in a range of about 20 degrees Celsius to about 25 degrees Celsius, or in a range of about 20 degrees Celsius to about 22 degrees Celsius.

The cover window CW may be disposed on the upper adhesive layer UAL. The cover window CW may protect the polarizing member POL, the bending protection layer BPL, and the display panel DP. The cover window CW may include reinforced glass or reinforced plastic. Alternatively, the cover window CW may be formed of or defined by a single layer or may have a structure in which a plurality of functional layers are stacked.

The light blocking layer BM may be disposed on the lower surface of the cover window CW. The light blocking layer BM may overlap a part of the peripheral area PA and the bending area BA. That is, the light blocking layer BM may not be disposed in the display area DA. In an embodiment, for example, the light blocking layer BM may include an inorganic material and/or an organic material containing black pigment, black dye, carbon black, or the like. These may be used alone or in combination with each other.

Figure 5:
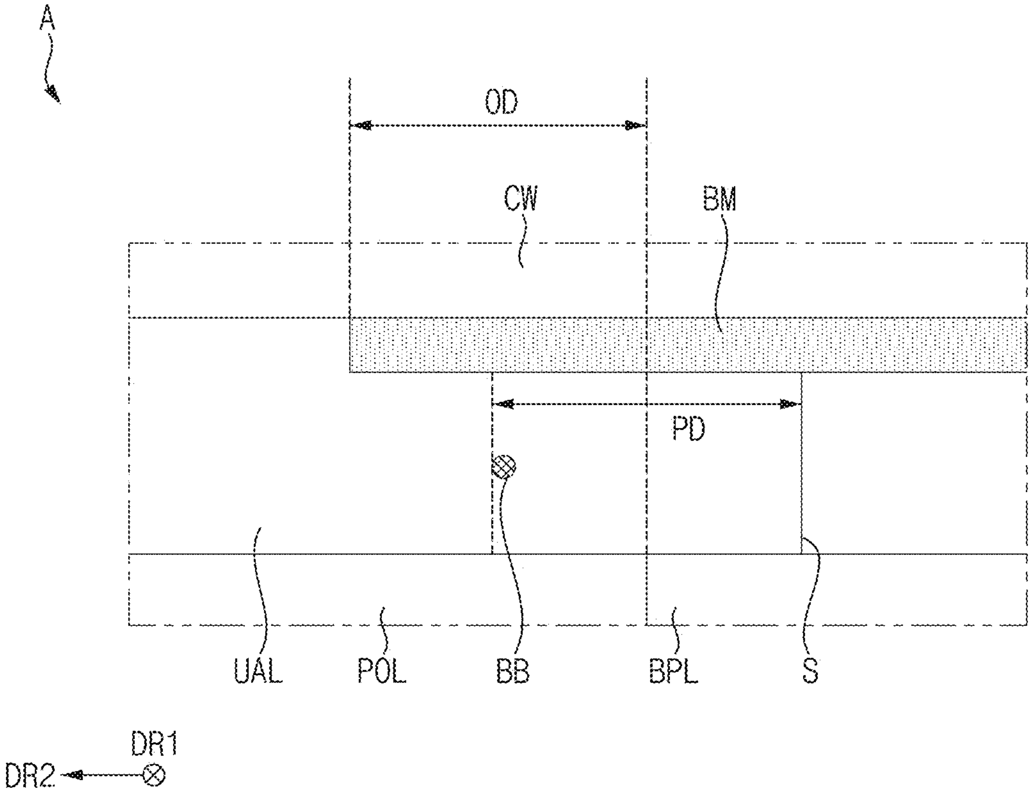
FIG. 5 is an enlarged cross-sectional view of area A of FIG. 3.

FIG. 5 is an enlarged cross-sectional view of area A of FIG. 3. Hereinafter, definitions of an overlapping distance OD and a penetration distance PD will be described with reference to FIG. 5.

Referring to FIG. 5, in a manufacturing process of a display device DD, after attaching the cover window CW to the polarizing member POL, bubbles may be formed between the polarizing member POL and the upper adhesive layer UAL. In this case, a process of removing the bubbles may be performed to prevent the bubbles from being visible. In an embodiment, the bubbles may be removed through an autoclave. The autoclave is a process of removing the bubbles by applying heat and pressure.

In an embodiment, in the autoclave process, bubbles BB (e.g., air) may penetrate the upper adhesive layer UAL from the outside. In this case, the shortest distance between the bubbles BB and a side surface S of the upper adhesive layer UAL adjacent to the light blocking layer BM may be defined as the penetration distance PD.

A part of the light blocking layer BM that overlaps the polarizing member POL in the plan view may be defined as the overlapping distance OD. When the overlapping distance OD is large, the dead space of the display device DD may increase. In this case, if the overlapping distance OD is small, the dead space of the display device DD may be reduced. The dead space of the display device DD may refer to areas other than the display area DA (i.e., the peripheral area PA, the bending area BA, and the second area A2 of FIG. 1).

As described above, in case where the stress relaxation rate of the upper adhesive layer UAL is less than about 0.36, the bubbles BB may remain inside the upper adhesive layer UAL after the autoclave process. In this case, a sufficient overlapping distance OD may be desired to be secured to prevent the bubble BB from being visible. That is, when the bubbles BB remain inside the upper adhesive layer UAL, the dead space of the display device DD may increase.

Referring back to FIGS. 3 and 4, the conductive tape CT may be disposed on the lower surface of the connection film CF. As illustrated in FIG. 4, in a state where a part of the display panel DP overlapping the bending area BA is bent, the conductive tape CT may compensate for a step difference. Alternatively, the conductive tape CT may include an adhesive material, and the conductive tape CT may be fixed to the lower surface of the functional member FM. In an embodiment, for example, the conductive tape CT may include an anisotropic conductive film (ACF) or the like.

The cover tape CTP may be disposed in the second area A2 on the driving integrated circuit DIC. The cover tape CTP may be disposed on a part of the bending protection layer BPL and a part of the connection film CF. In the second area A2 adjacent to the bending area BA, one end of the cover tape CTP may overlap the bending protection layer BPL, and an opposing end of the cover tape CTP may overlap the connection film CF. That is, the cover tape CTP may cover the driving integrated circuit DIC. The cover tape CTP may shield electromagnetic emitted from the driving integrated circuit DIC in the second area A2. Accordingly, electromagnetic interference (EMI) caused by the electromagnetic and an external device may be reduced. In an embodiment, for example, the cover tape CTP may include a synthetic resin such as PET or the like.

The display device DD according to embodiments may include the upper adhesive layer UAL having the stress relaxation rate in a range of about 0.36 to about 0.45 and attaching the polarizing member POL and the cover window CW. Accordingly, the bubbles penetrating into the upper adhesive layer UAL from the outside may not remain after the autoclave process. In such an embodiment, as bubbles do not remain in the upper adhesive layer UAL, the dead space of the display device DD may be allowed to be reduced.

Figure 6:
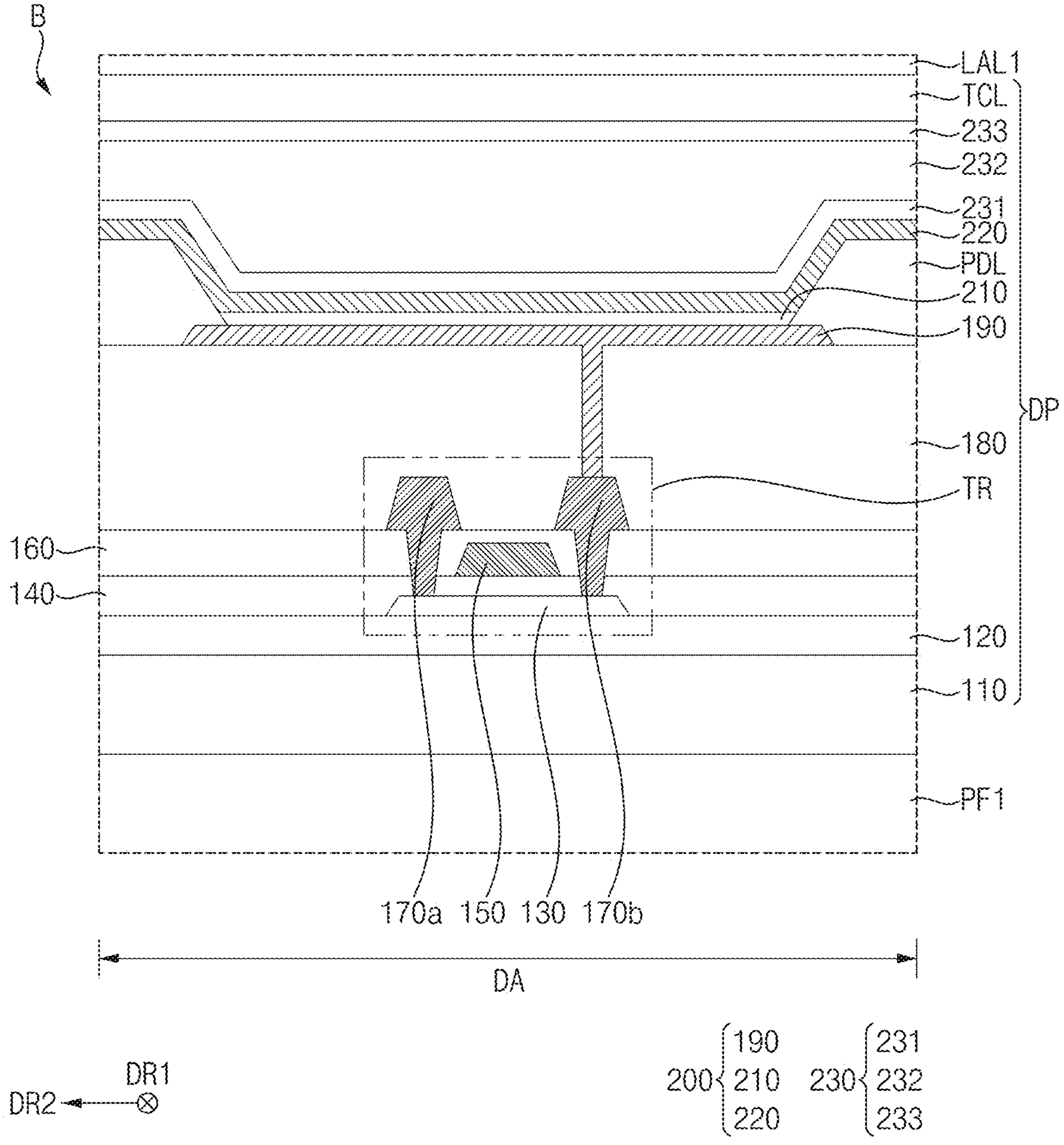
FIG. 6 is an enlarged cross-sectional view of area B of FIG. 3.

FIG. 6 is an enlarged cross-sectional view of area B of FIG. 3. Particularly, FIG. 6 is an enlarged cross-sectional view of a part of the display area DA of the display panel DP illustrated in FIG. 3.

Referring to FIG. 6, in an embodiment, the display panel DP may include a substrate 110, a buffer layer 120, a transistor TR, a gate insulating layer 140, an interlayer insulating layer 160, a planarization layer 180, a pixel defining layer PDL, a light emitting element 200, an encapsulation layer 230, and a touch layer TCL.

Here, the transistor TR may include an active pattern 130, a gate electrode 150, a source electrode 170*a*, and a drain electrode 170*b*. The light emitting element 200 may include a pixel electrode 190, a light emitting layer 210, and a common electrode 220. The encapsulation layer 230 may include a first inorganic encapsulation layer 231, an organic encapsulation layer 232, and a second inorganic encapsulation layer 233.

The substrate 110 may include a transparent material or an opaque material. In an embodiment, the substrate 110 may include or be made of a transparent resin substrate, e.g., a polyimide substrate or the like. Alternatively, the substrate 110 may include a quartz substrate, a synthetic quartz substrate, a calcium fluoride substrate, an F-doped quartz substrate, a soda-lime glass substrate, a non-alkali glass substrate, or the like. These may be used alone or in combination with each other.

The buffer layer 120 may be disposed on the substrate 110. The buffer layer 120 may prevent diffusion of impurities from the substrate 110 to the active pattern 130. In addition, the buffer layer 120 can control the transfer rate of heat generated in the process of forming the active pattern 130. In an embodiment, for example, the buffer layer 120 may include an inorganic material such as silicon oxide, silicon nitride, or the like. These may be used alone or in combination with each other.

The active pattern 130 may be disposed on the buffer layer 120. The active pattern 130 may include a source region, a drain region, and a channel region positioned between the source region and the drain region. In an embodiment, for example, the active pattern 130 may include a metal oxide semiconductor, an inorganic semiconductor (e.g., amorphous silicon, poly silicon), an organic semiconductor, or the like.

The metal oxide semiconductor may include a two-component compound ($AB_x$), a ternary compound ($AB_xC_y$), a four-component compound ($AB_xC_yD_z$), or the like containing indium (In), zinc (Zn), gallium (Ga), tin (Sn), titanium (Ti), aluminum (Al), hafnium (Hf), zirconium (Zr), magnesium (Mg), or the like. In an embodiment, for example, the metal oxide semiconductor may include zinc oxide ($ZnO_x$), gallium oxide ($GaO_x$), tin oxide ($SnO_x$), indium oxide ($InO_x$), indium gallium oxide (IGO), indium zinc oxide (IZO), indium tin oxide (ITO), indium zinc tin oxide (IZTO), indium gallium zinc oxide (IGZO), or the like. These may be used alone or in combination with each other.

The gate insulating layer 140 may be disposed on the buffer layer 120 and the active pattern 130. The gate insulating layer 140 may cover the active pattern 130. In an embodiment, for example, the gate insulating layer 140 may include an inorganic material such as silicon oxide ($SiO_x$), silicon nitride ($SiN_x$), silicon carbide ($SiC_x$), silicon oxynitride ($SiO_xN_y$), silicon oxycarbide ($SiO_xC_y$), or the like. These may be used alone or in combination with each other.

The gate electrode 150 may be disposed on the gate insulating layer 140. The gate electrode 150 may overlap the channel region of the active pattern 130. In an embodiment, for example, the gate electrode 150 may include a metal, an alloy, a conductive metal oxide, a transparent conductive material, or the like. These may be used alone or in combination with each other.

The interlayer insulating layer 160 may be disposed on the gate insulating layer 140 and the gate electrode 150. The interlayer insulating layer 160 may cover the gate electrode 150. In an embodiment, for example, the interlayer insulating layer 160 may include an inorganic material such as silicon oxide ($SiO_x$), silicon nitride ($SiN_x$), silicon carbide ($SiC_x$), silicon oxynitride ($SiO_xN_y$), silicon oxycarbide ($SiO_xC_y$), or the like. These may be used alone or in combination with each other.

The source electrode 170*a* and the drain electrode 170*b* may be disposed on the interlayer insulating layer 160. The source electrode 170*a* may be connected to the source region of the active pattern 130 through a contact hole defined through a first part of the gate insulating layer 140 and the interlayer insulating layer 160. The drain electrode 170*b* may be connected to the drain region of the active pattern 130 through a contact hole defined through a second part of the gate insulating layer 140 and the interlayer insulating layer 160. In an embodiment, for example, each of the source electrode 170*a* and the drain electrode 170*b* may include a metal, an alloy, a metal nitride, a conductive metal oxide, a transparent conductive material, or the like. These may be used alone or in combination with each other.

Accordingly, the transistor TR including the active pattern 130, the gate electrode 150, the source electrode 170*a*, and the drain electrode 170*b* may be disposed in the display area DA on the substrate 110.

The planarization layer 180 may be disposed on the interlayer insulating layer 160, the source electrode 170*a*, and the drain electrode 170*b*. The planarization layer 180 may sufficiently cover the source electrode 170*a* and the drain electrode 170*b*. The planarization layer 180 may have a substantially flat upper surface. The planarization layer 180 may include an inorganic material and/or an organic material. In an embodiment, for example, the planarization layer 180 may include an organic insulating material such as photoresist, polyacrylic resin, polyimide-based resin, polyamide-based resin, siloxane-based resin, acrylic resin, epoxy-based resin, or the like. These may be used alone or in combination with each other.

The pixel electrode 190 may be disposed on the planarization layer 180. The pixel electrode 190 may be connected to the drain electrode 170*b* through a contact hole defined through a portion of the planarization layer 180. In an embodiment, for example, the pixel electrode 190 may include a metal, an alloy, a conductive metal oxide, a transparent conductive material, or the like. These may be used alone or in combination with each other. The pixel electrode 190 may be an anode electrode. Alternatively, the pixel electrode 190 may be a cathode electrode.

The pixel defining layer PDL may be disposed on the planarization layer 180. An opening exposing at least a part of an upper surface of the pixel electrode 190 may be defined in the pixel defining layer PDL. The pixel defining layer PDL may include an organic material and/or an inorganic material. In an embodiment, for example, the pixel defining layer PDL may include an organic material such as photoresist, polyacrylic resin, polyimide resin, polyamide resin, siloxane resin, acrylic resin, epoxy resin, or the like. These may be used alone or in combination with each other.

The light emitting layer 210 may be disposed on the pixel electrode 190. In an embodiment, the light emitting layer 210 may be disposed within the opening of the pixel defining layer PDL. The light emitting layer 210 may include a light emitting material for emitting light. In an embodiment, for example, the light emitting layer 210 may include an organic light emitting material and/or an inorganic light emitting material.

The common electrode 220 may be disposed on the pixel defining layer PDL and the light emitting layer 210. In an embodiment, for example, the common electrode 220 may include a metal, an alloy, a metal nitride, a conductive metal oxide, a transparent conductive material, or the like. These may be used alone or in combination with each other. The common electrode 220 may be a cathode electrode. Alternatively, the common electrode 220 may be an anode electrode.

Accordingly, the light emitting element 200 including the pixel electrode 190, the light emitting layer 210 and the common electrode 220 may be disposed on the substrate 110 in the display area DA. The light emitting element 200 may be electrically connected to the transistor TR.

The encapsulation layer 230 may be disposed on the common electrode 220. The encapsulation layer 230 may prevent impurities, moisture, or the like from permeating the light emitting element 200 from the outside. In an embodiment, as described above, the encapsulation layer 230 may include a first inorganic encapsulation layer 231, an organic encapsulation layer 232, and a second inorganic encapsulation layer 233.

The first inorganic encapsulation layer 231 may be disposed on the common electrode 220. The first inorganic encapsulation layer 231 may include an inorganic material such as silicon oxide, silicon nitride, silicon oxynitride, or the like. These may be used alone or in combination with each other.

The organic encapsulation layer 232 may be disposed on the first inorganic encapsulation layer 231. The organic encapsulation layer 232 may have a sufficient thickness and a substantially flat upper surface. In an embodiment, for example, the organic encapsulation layer 232 may include a polymer cured material such as polyacrylate or the like.

The second inorganic encapsulation layer 233 may be disposed on the organic encapsulation layer 232. The first inorganic encapsulation layer 231 and the second inorganic encapsulation layer 233 may have a larger area than the organic encapsulation layer 232. The organic encapsulation layer 232 may not be exposed to the outside by the first inorganic encapsulation layer 231 and the second inorganic encapsulation layer 233. In an embodiment, for example, the second inorganic encapsulation layer 233 may include an inorganic material such as silicon oxide, silicon nitride, silicon oxynitride, or the like. These may be used alone or in combination with each other.

The touch layer TCL may be disposed on the second inorganic encapsulation layer 233. The touch layer TCL may sense a user's touch. In an embodiment, for example, the touch layer TCL may include a first touch insulating layer, a first touch electrode disposed on the first touch insulating layer, a second touch insulating layer covering the first touch electrode, a second touch electrode disposed on the second touch insulating layer and connected to the first touch electrode, and a protective layer covering the second touch electrode. Each of the first and second touch insulating layers may include an inorganic material and the protective layer may include an organic material.

Figure 7:
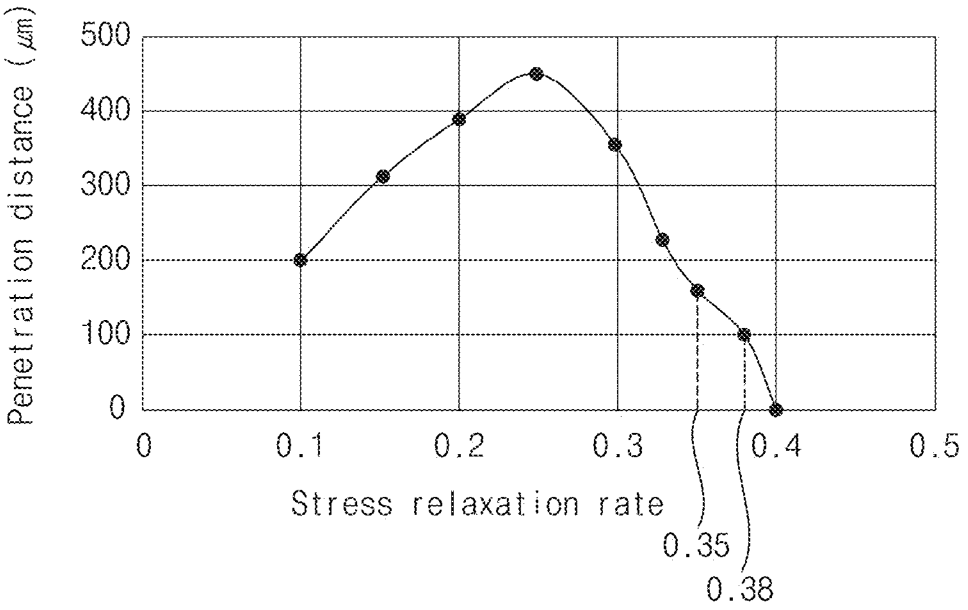
FIG. 7 is a graph showing a penetration distance versus a stress relaxation rate.
Figure 8:
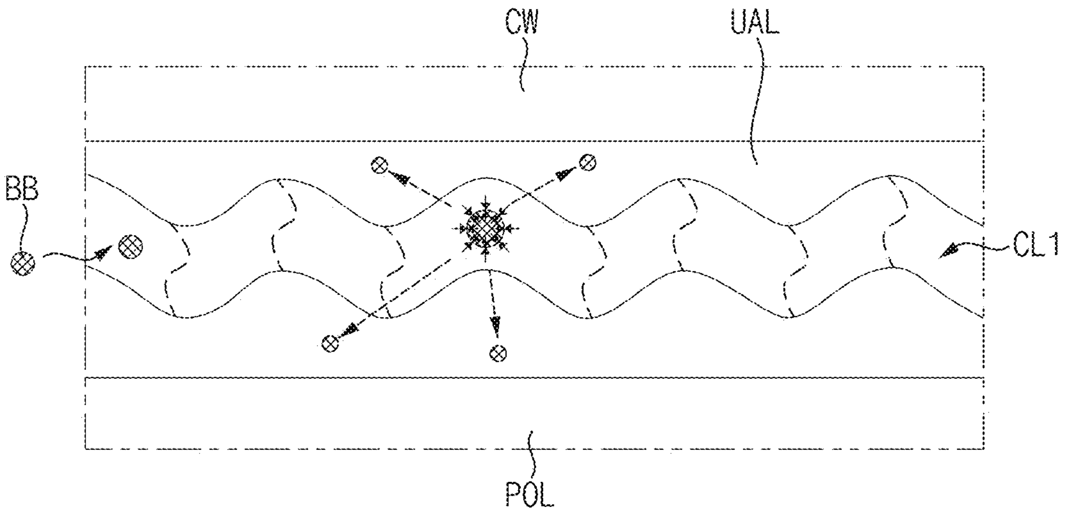
FIG. 8 is a cross-sectional view for explaining an example of a process of suppressing bubbles from penetrating into an upper adhesive layer from the outside in an autoclave process.
Figure 9:
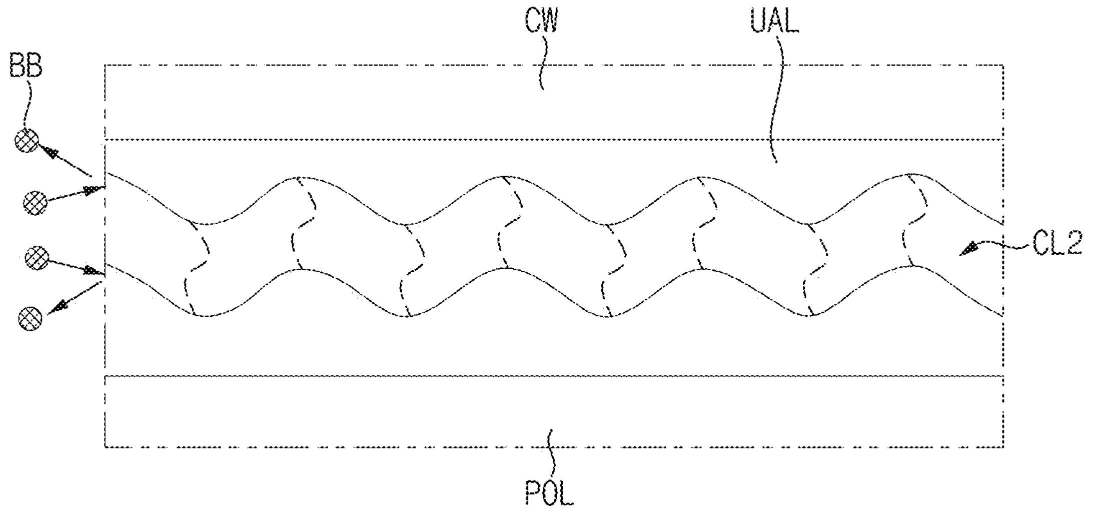
FIG. 9 is a cross-sectional view for explaining another example of a process of suppressing bubbles from penetrating into an upper adhesive layer from the outside in an autoclave process.

FIG. 7 is a graph showing a penetration distance versus a stress relaxation rate. FIG. 8 is a cross-sectional view for explaining an example of a process of suppressing bubbles from penetrating into an upper adhesive layer from the outside in an autoclave process. FIG. 9 is a cross-sectional view for explaining another example of a process of suppressing bubbles from penetrating into an upper adhesive layer from the outside in an autoclave process.

Hereinafter, the penetration distance versus the stress relaxation rate of the upper adhesive layer will be described.

The upper adhesive layer (e.g., the upper adhesive layer UAL of FIG. 3) was formed using OCA including or containing a monomer, an oligomer, a photo initiator, a crosslinking agent, and a molecular weight modifier. In this case, based on the total content of the upper adhesive layer UAL, the monomer include about 10 wt % to about 15 wt % of 2-hydroxyethyl acrylate, about 2 wt % to about 3 wt % of butyl acrylate, about 1 wt % to about 2 wt % of isooctyl acrylate, and about 1 wt % to about 2 wt % of isobornyl acrylate. Based on the total content of the upper adhesive layer UAL, the oligomer includes about 65 wt % to about 75 wt % of 2-hydroxyethylhexyl acrylate. Based on the total content of the upper adhesive layer UAL, the photo initiator includes about 0.3 wt % to about 0.6 wt % of Irgacure 184 and about 0.1 wt % to about 0.2 wt % of Irgacure 651. Based on the total content of the upper adhesive layer UAL, the crosslinking agent includes about 0.1 wt % to about 0.3 wt % of pentaerythritol triacrylate and about 0.1 wt % to about 0.2 wt % of pentaerythritol tetraacrylate. Based on the total content of the upper adhesive layer UAL, the molecular weight modifier includes about 0.1 wt % to about 0.2 wt % of n-dodecyl mercaptan.

Through this, the penetration distance versus the stress relaxation rate of the upper adhesive layer UAL was measured.

As a result, when the stress relaxation rate of the upper adhesive layer UAL is greater than about 0.1 and less than about 0.4, it can be confirmed that the penetration distance PD is not zero. That is, when the stress relaxation rate of the upper adhesive layer UAL is greater than about 0.1 and less than about 0.4, it can be confirmed that the penetration of the bubbles into the upper adhesive layer UAL from the outside cannot be fundamentally prevented in the autoclave process.

However, referring to FIGS. 5, 7, and 8, when the stress relaxation rate of the upper adhesive layer UAL is greater than or equal to about 0.36 and less than about 0.4, the upper adhesive layer UAL includes a first crosslinked material CL1 formed by crosslinking monomers. Due to the high crosslinking density of the first crosslinked material CL1, it can be confirmed that the bubbles BB that penetrated into the upper adhesive layer UAL from the outside during the autoclave process are dispersed and gradually disappear over time.

On the other hand, referring to FIGS. 5, 7, and 9, when the stress relaxation rate of the upper adhesive layer UAL is about 0.4 or greater, it can be confirmed that the penetration distance PD is zero. That is, when the stress relaxation rate of the upper adhesive layer UAL is greater than or equal to about 0.4, the upper adhesive layer UAL includes a second crosslinked material CL2 formed by crosslinking monomers. Due to the high crosslinking density of the second crosslinked material CL2, the second crosslinked material CL2 has a network structure. In this case, it can be confirmed that, due to the network structure of the second crosslinked material CL2, penetration of the bubbles BB from the outside into the upper adhesive layer UAL is fundamentally blocked during the autoclave process.

Figure 10:
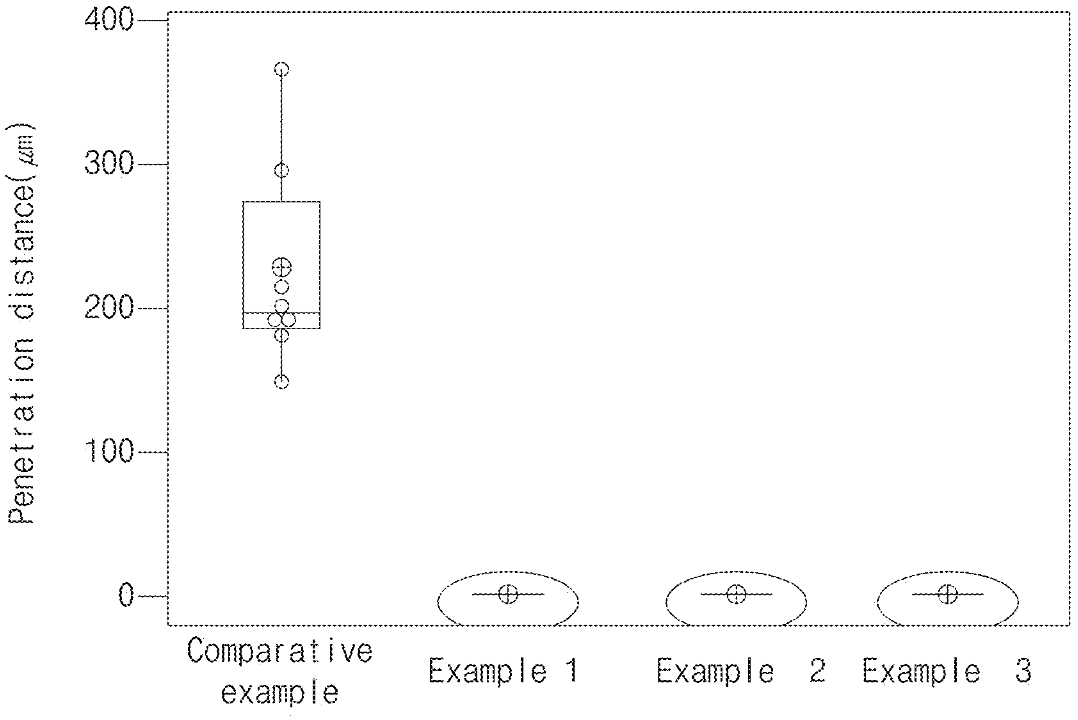
FIG. 10 is a view for explaining a penetration distance according to comparative example and example.

FIG. 10 is a view for explaining a penetration distance according to comparative example and example. Hereinafter, the penetration distance according to comparative example and examples will be described.

The upper adhesive layer (e.g., the upper adhesive layer UAL of FIG. 3) according to examples 1, 2, and 3 was formed using OCA including or containing a monomer, an oligomer, a photo initiator, a crosslinking agent, and a molecular weight modifier. At this time, based on the total content of the upper adhesive layer UAL, the monomer include about 10 wt % to about 15 wt % of 2-hydroxyethyl acrylate, about 2 wt % to about 3 wt % of butyl acrylate, about 1 wt % to about 2 wt % of isooctyl acrylate, and about 1 wt % to about 2 wt % of isobornyl acrylate. Based on the total content of the upper adhesive layer UAL, the oligomer includes about 65 wt % to about 75 wt % of 2-hydroxyethylhexyl acrylate. Based on the total content of the upper adhesive layer UAL, the photo initiator includes about 0.3 wt % to about 0.6 wt % of Irgacure 184 and about 0.1 wt % to about 0.2 wt % of Irgacure 651. Based on the total content of the upper adhesive layer UAL, the crosslinking agent includes about 0.1 wt % to about 0.3 wt % of pentaerythritol triacrylate and about 0.1 wt % to about 0.2 wt % of pentaerythritol tetraacrylate. Based on the total content of the upper adhesive layer UAL, the molecular weight modifier includes about 0.1 wt % to about 0.2 wt % of n-dodecyl mercaptan.

On the other hand, the upper adhesive layer according to the comparative example was formed by curing OCA including a monomer, an oligomer, a photo initiator, a crosslinking agent, and a molecular weight modifier with ultraviolet rays. At this time, the types of the monomer, the oligomer, the photoinitiator, and the molecular weight modifier are the same as the types of materials included in the upper adhesive layer UAL according to the examples 1, 2, and 3, and the crosslinking agent includes pentaerythritol diacrylate.

For the upper adhesive layer UAL according to the examples 1, 2, and 3, the number of occurrence of penetration bubbles were measured after the autoclave process through a plurality of experiments. At this time, experiments on the upper adhesive layer UAL satisfying the examples 1, 2, and 3 were performed under the same conditions and at different times. In addition, for the upper adhesive layer according to the comparative example, the number of occurrence of penetration bubbles were measured after the autoclave process through a plurality of experiments.

TABLE 1

| | Comparative example | Examples 1, 2, and 3 |
|---|---|---|
| Modulus (Mpa) | 0.20(before curing)/0.23(after curing) | 0.22 |
| Stress relaxation rate | 0.07(before curing)/0.38(after curing) | 0.41 |
| Penetration distance (μm) | Up to 365 μm | 0 |

As a result, referring to Table 1 and FIGS. 5 and 10, it can be confirmed that the penetration distance PD is zero in the upper adhesive layer UAL according to the examples 1, 2, and 3. That is, in the upper adhesive layer UAL according to the examples 1, 2, and 3, it can be confirmed that the bubbles are fundamentally blocked from penetrating into the upper adhesive layer UAL from the outside in the autoclave process.

On the other hand, in the upper adhesive layer according to the comparative example, it can be confirmed that the maximum penetration distance PD is 365 μm. That is, in the upper adhesive layer satisfying the comparative example, it can be confirmed that the bubbles cannot be blocked from penetrating into the upper adhesive layer from the outside in the autoclave process, and the penetrated bubbles do not disappear.

Embodiments of the disclosure can be applied to various display devices. For example, embodiments of the invention can be applied to high-resolution smartphones, mobile phones, smart pads, smart watches, tablet personal computers (PCs), vehicle navigation systems, televisions, computer monitors, laptops, or the like.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:

a display panel including a display area, in which a plurality of pixels are arranged, and a peripheral area adjacent to the display area;

a polarizing member disposed on the display panel;

a cover window disposed on the polarizing member; and an adhesive layer attaching the polarizing member and the cover window to each other, wherein the adhesive layer has a stress relaxation rate in a range of about 0.36 to about 0.45;

wherein the adhesive layer has a creep value in a range of about 6% to about 7%.

2. The display device of claim 1, wherein the adhesive layer includes a monomer, an oligomer, a photo initiator, a crosslinking agent, and a molecular weight control agent.

3. The display device of claim 2, wherein the crosslinking agent include a first crosslinking agent having three functional groups and a second crosslinking agent having four functional groups.

4. The display device of claim 3, wherein each of the first crosslinking agent and the second crosslinking agent has an acrylate functional group.

5. The display device of claim 3, wherein the first crosslinking agent includes pentaerythritol triacrylate, and the second crosslinking agent includes pentaerythritol tetraacrylate.

6. The display device of claim 5, wherein a content of the first crosslinking agent is in a range of about 0.1 wt % to about 0.3 wt % based on a total content of the adhesive layer, and a content of the second crosslinking agent is in a range of about 0.1 wt % to about 0.2 wt % based on the total content of the adhesive layer.

7. The display device of claim 2, wherein the oligomer includes 2-hydroxyethylhexyl acrylate.

8. The display device of claim 2, wherein the monomer includes at least one selected from 2-hydroxyethyl acrylate, butyl acrylate, isooctyl acrylate, and isobornyl acrylate.

9. The display device of claim 1, wherein the adhesive layer includes an optically clear adhesive.

10. The display device of claim 1, further comprising:

a light blocking layer disposed on a lower surface of the cover window and overlapping a part of the peripheral area.

11. A display device comprising:
a display panel including a display area, in which a plurality of pixels are arranged, and a peripheral area adjacent to the display area;
a polarizing member disposed on the display panel;
a cover window disposed on the polarizing member; and
an adhesive layer attaching the polarizing member and the cover window to each other, wherein the adhesive layer has a stress relaxation rate in a range of about 0.36 to about 0.45;
wherein the adhesive layer has a modulus in a range of 0.15 Mpa to about 0.3 Mpa at a room temperature.

12. A display device comprising:
a display panel including a display area, in which a plurality of pixels are arranged, and a peripheral area adjacent to the display area;
a polarizing member disposed on the display panel;
a cover window disposed on the polarizing member; and
an adhesive layer attaching the polarizing member and the cover window, wherein the adhesive layer has a stress relaxation rate in a range of about 0.36 to about 0.45, a creep value of about 6% to about 7%, and a modulus in a range of about 0.15 Mpa to about 0.3 Mpa at a room temperature.

13. The display device of claim 12, wherein the adhesive layer includes a monomer, an oligomer, a photo initiator, a crosslinking agent, and a molecular weight control agent.

14. The display device of claim 13, wherein the crosslinking agent include a first crosslinking agent having three functional groups and a second crosslinking agent having four functional groups.

15. The display device of claim 14, wherein each of the first crosslinking agent and the second crosslinking agent has an acrylate functional group.

16. The display device of claim 14, wherein
the first crosslinking agent includes pentaerythritol triacrylate, and
the second crosslinking agent includes pentaerythritol tetraacrylate.

17. The display device of claim 16, wherein
a content of the first crosslinking agent is in a range of about 0.1 wt % to about 0.3 wt %, based on a total content of the adhesive layer and
a content of the second crosslinking agent is in a range of about 0.1 wt % to about 0.2 wt % based on the total content of the adhesive layer.

18. The display device of claim 12, wherein the adhesive layer includes an optically clear adhesive.

19. The display device of claim 12, further comprising:
a light blocking layer disposed on a lower surface of the cover window and overlapping a part of the peripheral area.

* * * * *